United States Patent
Kim et al.

(10) Patent No.: US 8,659,459 B2
(45) Date of Patent: Feb. 25, 2014

(54) DIGITAL-TO-ANALOG CONVERTER, ANALOG-TO-DIGITAL CONVERTER INCLUDING SAME, AND SEMICONDUCTOR DEVICE

(75) Inventors: Yong-Woo Kim, Seoul (KR); Michael Choi, Seoul (KR); Jung-Ho Lee, Gunpo-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 69 days.

(21) Appl. No.: 13/228,794

(22) Filed: Sep. 9, 2011

(65) Prior Publication Data
US 2012/0081243 A1  Apr. 5, 2012

(30) Foreign Application Priority Data
Sep. 30, 2010  (KR) .................. 10-2010-0095271

(51) Int. Cl.
*H03M 1/66*  (2006.01)
(52) U.S. Cl.
USPC .......................................... 341/150; 341/144

(58) Field of Classification Search
USPC ................. 341/150, 144, 172, 120, 110, 145; 375/219; 257/532, 303
See application file for complete search history.

(56) References Cited

U.S. PATENT DOCUMENTS

| | | | |
|---|---|---|---|
| 5,889,486 A | 3/1999 | Opris et al. | |
| 7,271,758 B2 | 9/2007 | Piasecki et al. | |
| 2004/0257256 A1 | 12/2004 | Leung et al. | |
| 2005/0052299 A1* | 3/2005 | Oliaei | 341/143 |
| 2007/0132626 A1 | 6/2007 | Hurrell | |
| 2008/0002332 A1* | 1/2008 | Chen | 361/328 |
| 2010/0039303 A1 | 2/2010 | Tsukamoto | |

FOREIGN PATENT DOCUMENTS

| | | |
|---|---|---|
| JP | 2002-314419 | 10/2002 |
| JP | 2010-045723 | 2/2010 |

* cited by examiner

*Primary Examiner* — Joseph Lauture
(74) *Attorney, Agent, or Firm* — Volentine & Whitt, PLLC (57) ABSTRACT

Provided are a capacitor digital-to-analog (DAC), an analog-to-digital converter (ADC) including the capacitor DAC, and a semiconductor device. The DAC includes at least one dummy capacitor configured to cause capacitors included in a capacitor array to have a capacitance that is an integer multiple of the capacitance of a unit capacitor.

34 Claims, 11 Drawing Sheets

FIG. 13

DIGITAL-TO-ANALOG CONVERTER, ANALOG-TO-DIGITAL CONVERTER INCLUDING SAME, AND SEMICONDUCTOR DEVICE

CROSS-REFERENCE TO RELATED APPLICATION

This application claims priority under 35 U.S.C. §119 to Korean Patent Application No. 10-2010-0095271 filed on Sep. 30, 2010, the subject matter of which is hereby incorporated by reference.

BACKGROUND OF THE INVENTION

Embodiments of the inventive concept relate to analog-to-digital converters (ADCs) and digital-to-analog converters (DACs). More particularly, embodiments of the inventive concept relate to capacitor DAC converting circuits, ADCs including capacitor DAC converting circuits, and semiconductor devices incorporating same.

ADCs are a well known class of circuits that generate corresponding digital data values (or digital code) in response to an applied analog signal. Quite commonly, the generated digital code is correlated to one or more voltage levels of the analog signal, and a sequence of digital codes may be generated for the analog signal over a defined period of time. DACs are also a well known class of circuits that essentially operate to reproduce an analog signal from a corresponding set of digital codes.

There are many different types of ADCs and DACs. ADCs and DACs are used in many applications, and sometimes used in conjunction with one another to facilitate analog signal and digital signal processing. In certain circuits DACs are used within an ADC.

One type of DAC is the so-called capacitor DAC. Capacitor DACs are used in a variety of application such as successive approximation register (SAR) circuits and methods. SAR circuits and methods may be used, for example, to compare data by repeatedly performing digital-to-analog conversion to thereby determine the bit values of the data being compared. While capacitor DACs prove useful in a certain applications, the constituent capacitors are relatively difficult to fabricate within narrow performance tolerances. That is, the constituent capacitors exhibit performance characteristics that vary with fabrication process variations. As a result, circuits incorporating capacitor DACs (e.g., ADC/DAC circuits and SAR circuits) tend to run at relatively low operating speed.

SUMMARY OF THE INVENTION

Embodiments of the inventive concept provide digital-to-analog converters (DACs) that perform better at high operating speeds. Embodiments of the invention provide DACs including capacitors that are markedly less susceptible to performance deviation due to fabrication process variations. In certain embodiments of the inventive concept, DACs include capacitors having a capacitance defined in relation to a unit capacitor capacitance. As such, the capacitors are less sensitive to process variation and occupy relatively less area.

Other embodiments of the inventive concept provide analog-to-digital converters (ADCs) including this type of DAC, and still other embodiments of the inventive concept provide semiconductor devices incorporating this type of ADC and/or DAC.

In one aspect, embodiments of the inventive concept provide a digital-to-analog converter (DAC) receiving a digital output and generating a corresponding analog signal, the DAC comprising; a capacitor array arranging a plurality of capacitors, and at least one dummy capacitor configured within the capacitor array and having a capacitance determined such that each capacitor in the plurality of capacitors has a respective capacitance that is an integer multiple of a capacitance of a unit capacitor.

In another aspect, embodiments of the inventive concept provide a digital-to-analog converter (DAC) receiving a digital output and generating a corresponding analog signal, the DAC comprising; a first capacitor bank electrically connected to a first conductive line, a first split capacitor having a first terminal electrically connected to the first conductive line, a second conductive line electrically connected to a second terminal of the first split capacitor, a second capacitor bank electrically connected to the second conductive line, a second split capacitor having a first terminal electrically connected to the second conductive line, a third conductive line electrically connected to a second terminal of the second split capacitor, a third capacitor bank electrically connected to the third conductive line, a first compensating capacitor connected across the first split capacitor to compensate for a parasitic capacitance of the first conductive line, a second compensating capacitor connected across the second split capacitor to compensate for a parasitic capacitance of the second conductive line, and a third compensating capacitor connected across the second split capacitor to compensate for the parasitic capacitance of the first conductive line.

In another aspect, embodiments of the inventive concept provide an analog-to-digital converter (ADC), comprising; a digital-to-analog converter (DAC) configured to generate a hold voltage signal in response to a digital output and an input analog signal, a comparator circuit configured to compare the hold voltage signal with the reference voltage signal to generate a comparison output voltage signal, and a signal processing circuit configured to perform successive approximation based on the comparison output voltage signal to generate the digital output. The DAC comprises a capacitor array arranging a plurality of capacitors, and at least one dummy capacitor configured within the capacitor array and having a capacitance determined such that each capacitor in the plurality of capacitors has a respective capacitance that is an integer multiple of a capacitance of a unit capacitor.

In another aspect, embodiments of the inventive concept provide a semiconductor device, comprising; an analog-to-digital converter (ADC) configured to convert an analog input signal into a corresponding digital output; and a digital signal processing circuit configured to perform digital signal processing on the digital output. The ADC includes a digital-to-analog converter (DAC) configured to generate a hold voltage signal in response to a digital output and an input analog signal, a comparator circuit configured to compare the hold voltage signal with the reference voltage signal to generate a comparison output voltage signal, and a signal processing circuit configured to perform successive approximation based on the comparison output voltage signal to generate the digital output. The DAC comprises a capacitor array arranging a plurality of capacitors, and at least one dummy capacitor configured within the capacitor array and having a capacitance determined such that each capacitor in the plurality of capacitors has a respective capacitance that is an integer multiple of a capacitance of a unit capacitor.

BRIEF DESCRIPTION OF THE DRAWINGS

The foregoing and other features and advantages of the inventive concepts will be apparent from the more particular description of certain embodiments of the inventive concepts as illustrated in the accompanying drawings. Throughout the drawings and written description like reference numbers and labels are used to denote like or similar elements. Elements and features presented in the drawings are not drawn to scale. In the drawings.

DETAILED DESCRIPTION

Various embodiments of the inventive concept will now be described in some additional detail with reference to the accompanying drawings. It should be noted that the inventive concept may be embodied in different forms and should not be construed as being limited to only the illustrated embodiments. Rather, these embodiments are provided so that this disclosure is thorough and complete and fully conveys the inventive concept to those skilled in the art.

It will be understood that when an element is referred to as being "connected to" or "connected with" another element, it may be directly connected or connected to the other element through intervening elements. In contrast, when an element is referred to as being "directly connected to" or "directly connected with" another element, there are no intervening elements present. The term "and/or" combines the conjunctive with the alternative to specify any one listed item as well as all possible combinations thereof.

It will be understood that, although the terms first, second, third, etc. may be used herein to describe various elements, components, regions, layers and/or sections, these elements, components, regions, and/or sections should not be limited by these terms. These terms are only used to distinguish one element, component, region, or section from another. Thus, a first element, component, region, or section discussed below could be termed a second element, component, region, or section without departing from the teachings of the inventive concept.

Terms describing spatial relationships, such as "beneath," "below," "lower," "above," "upper" and the like, should be interpreted with respect to orientations depicted in the drawings. If an orientation depicted in the drawings is changed, it is intended that such spatial terms change as well to reflect the new orientation. For example, if a device shown in the drawings is turned upside down, elements described as "below" or "beneath" other elements or features would then be "above" the other elements or features and, accordingly, "below" and "beneath" should be changed to "above." Clearly, such changes in orientation do not constitute departures from the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
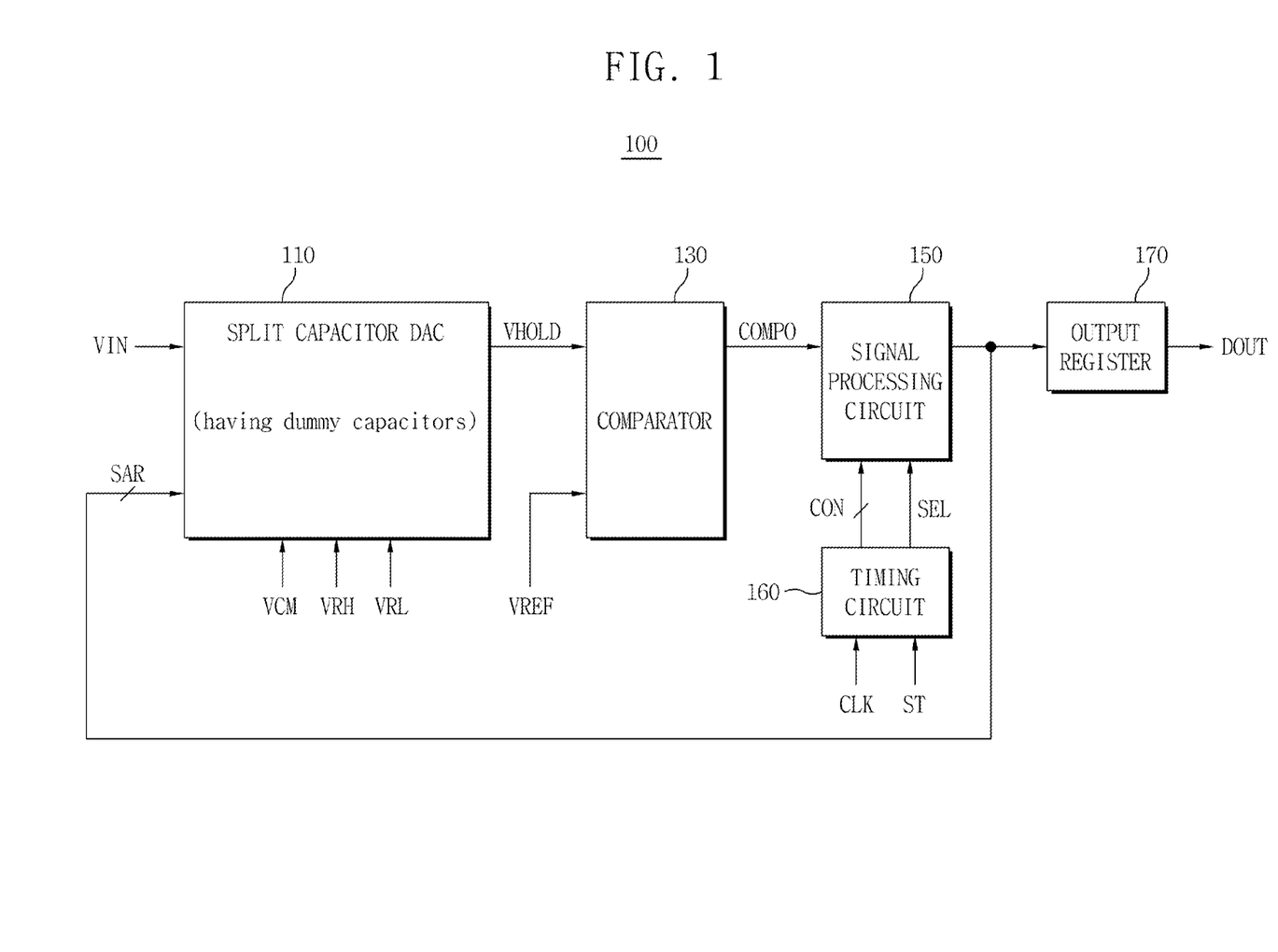
FIG. 1 is a block diagram illustrating an analog-to-digital converter (ADC) in accordance with an embodiment of the inventive concept.

Figure (FIG. 1 is a block diagram illustrating an analog-to-digital converter (ADC) 100 in accordance with an embodiment of the inventive concept.

Referring to FIG. 1, the ADC 100 generally comprises a digital-to-analog converter (DAC) 110, a comparator circuit 130 and a signal processing circuit 150.

The DAC 110 in the illustrated embodiment includes a capacitor array including at least one split capacitor having a capacitance defined in relation to (e.g., defined as a multiple of) a given unit capacitance. The DAC 110 converts a digital output SAR into a corresponding analog signal (hold voltage signal VHOLD) using an analog input signal VIN.

The hold voltage signal VHOLD is applied to comparator 130 and compared with a reference voltage signal VREF to generate a comparison output voltage signal COMPO.

The signal processing circuit 150 performs successive approximation on the comparison output voltage signal COMPO to generate the digital output SAR.

In the illustrated example of FIG. 1, the ADC 100 further comprises a timing circuit 160 and an output register 170.

The timing circuit 160 generates a conversion control signal CON and a conversion select signal SEL in response to an applied clock signal CLK and a conversion start signal ST. One or both of the conversion control signal CON and the conversion select signal SEL may be applied to control the operation of the signal processing circuit 150. The output register 170 stores the digital output SAR, and outputs the digital output SAR as output data in response to the output the signal processing circuit 150.

The ADC 100 of FIG. 1 may provide any reasonable number of digital data bits (e.g., 10 bits) to generate the digital output SAR.

The ADC 100 of FIG. 1 is assumed to use a successive-approximation technique for analog-to-digital conversion. Those skilled in the art recognize that this may be accomplished using a variety of circuits and methods, but certain principles of successive approximation will now be described.

Each bit of a digital code representing a sampled value of an analog signal may be determined through a single iteration starting with a most significant bit (MSB or $1^{st}$). The MSB is set to a specific logic value (e.g., 0) and the next significant bit ($2^{nd}$) is set to another logic value (e.g., 1). The resulting data value may then be converted to an intermediate analog signal. If the actual sampled value of the analog signal has a level less than the intermediate analog signal, the MSB of the digital code may be determined to be "0". On the contrary, if the sampled value of the analog signal has a level greater than the intermediate analog signal, the MSB of the digital code is determined to be "1". The next significant bit ($2^{nd}$) may then be set to "1", and a next most significant bit ($3^{rd}$) may be set to "0". The resulting data value obtained in this manner may be used to generate a next (or new) intermediate analog signal. The new intermediate analog signal is then compared with a sampled value of the analog signal to determine the value of a next significant bit of a digital code corresponding to the new intermediate analog signal. This approximation operation is successively performed until all bits of the digital code ($1^{st}$ through Nth) are determined.

In the embodiment of the inventive concept illustrated in FIG. 1, the ADC 100 comprises digital-to-analog converting circuit 110 that includes dummy capacitors and capacitors having a capacitance that is a multiple of a given unit capacitance.

Figure 2:
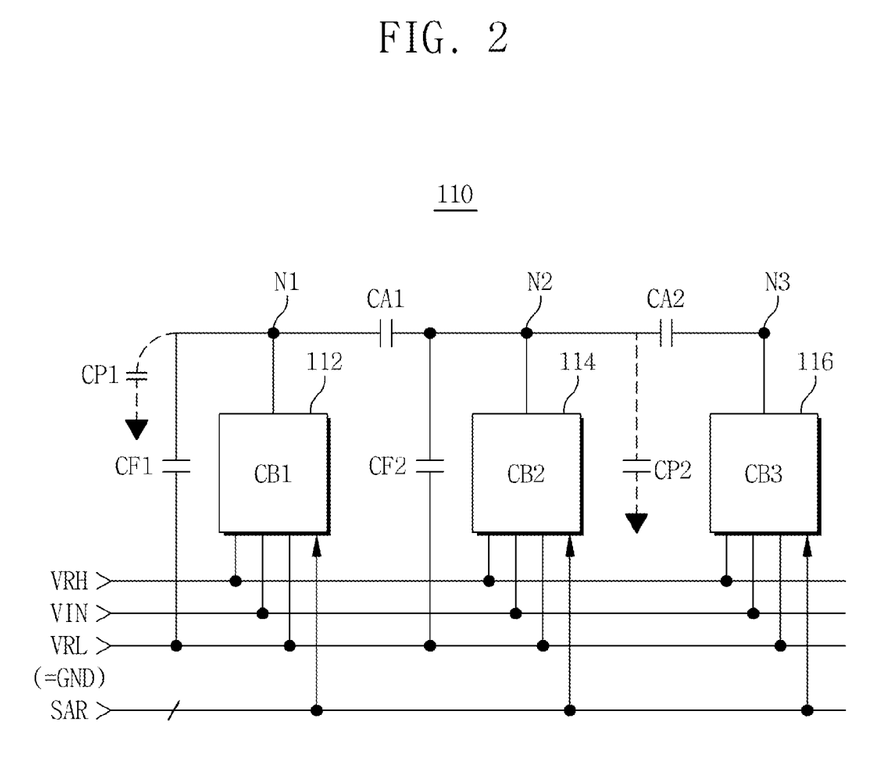
FIG. 2 is a circuit diagram further illustrating one example of a digital-to-analog converter (DAC) that may be included in the ADC of FIG. 1.
Figure 3:
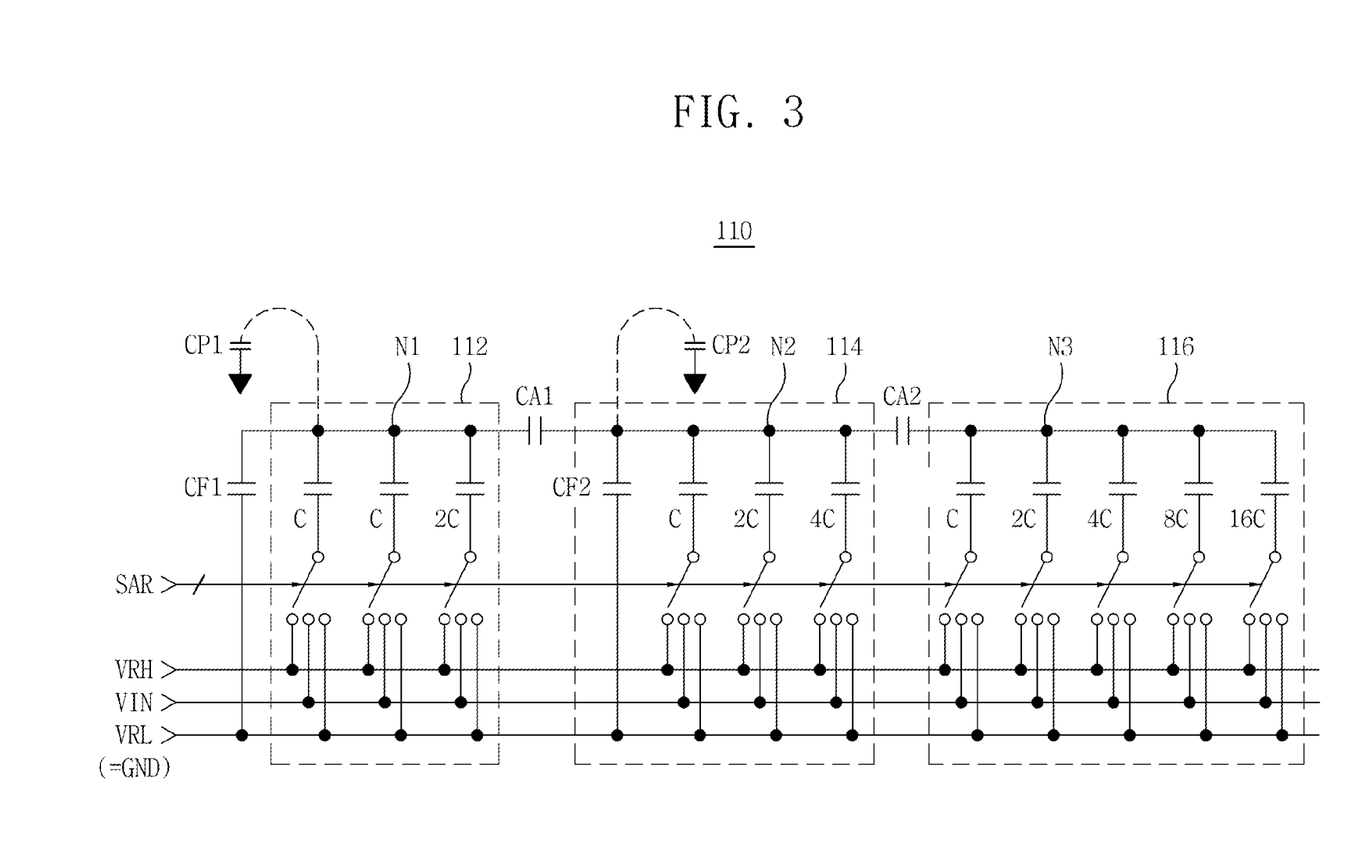
FIG. 3 is another circuit diagram still further illustrating the DAC of FIG. 2.

FIG. 2 is a circuit diagram further illustrating one possible example of DAC 110 of FIG. 1. FIG. 3 is a circuit diagram still further illustrating DAC 110 of FIG. 2. In FIG. 2, a double-split-capacitor DAC is shown as one possible example of a DAC that may be used in certain embodiments of the inventive concept.

Referring to FIG. 2, DAC 110 comprises a first split capacitor CA1, a second split capacitor CA2, a first capacitor bank (CB1) 112, a second capacitor bank (CB2) 114, a third capacitor bank (CB3) 116, a first dummy capacitor CF1 and a second dummy capacitor CF2.

The first split capacitor CA1, the second split capacitor CA2, the first capacitor bank 112, the second capacitor bank 114, the third capacitor bank 116, the first dummy capacitor CF1 may each have a capacitance that is an integer multiple of the capacitance of a unit capacitor.

In FIG. 3, the first capacitor bank 112 is disposed in front of the first split capacitor CA1 and the second capacitor bank 114. In this configuration, the first split capacitor is between the first capacitor bank 112 and the second capacitor bank 114. For purposes of general illustration, the first capacitor bank 112 is assumed to include capacitors having respective capacitances of C, C, and 2 C, where "C" is the given unit capacitance.

The second capacitor bank 114 is disposed behind the first split capacitor CA1 and in front of the second split capacitor CA2, and includes capacitors having respective capacitances of C, 2 C, and 4 C.

The third capacitor bank 116 is disposed behind the second split capacitor CA2, and includes capacitors having capacitances of C, 2 C, 4 C, 8 C and 16 C.

A common top node N1 of the capacitors in the first capacitor bank 112 is connected to a first terminal of the first split capacitor CA1. A common top node N2 of the capacitors in the second capacitor bank 114 is connected a second terminal of the first split capacitor CA1 and a first terminal of the second split capacitor CA2. And a common top node N3 of the capacitors included in the third capacitor bank 116 is connected to a second terminal of the second split capacitor CA2.

One of the analog input signal VIN, a first reference voltage VRH and a second reference voltage VRL is switch-selectively applied to the respective bottom nodes of the capacitors included in each one of the first capacitor bank 112, second capacitor bank 114 and third capacitor bank 116. Thus, in the illustrated embodiment of FIG. 1, each of the respective capacitor node switches provides one of the analog input signal VIN, first reference voltage VRH or second reference voltage VRL to the bottom node of the capacitors in accordance with the digital output SAR. In one more particular embodiment of the inventive concept, the first reference voltage VRH may be a supply voltage VDD, and the second reference voltage VRL may be ground voltage.

The bottom nodes of the first dummy capacitor CF1 and the second dummy capacitor CF2 are connected in the illustrated embodiment to the second reference voltage VRL.

In FIGS. 2 and 3, CP1 denotes a first parasitic capacitance associated with the first common node N1. That is, the first parasitic capacitance CP1 associated with the conductive line(s) connected to the first terminal of the first split capacitor CA1 is accounted for in the illustrated embodiment. A second parasitic capacitance CP2 is associated with the second common node N2. That is, the second parasitic capacitance CP2 associated with conductive line(s) connected between the first split capacitor CA1 and the second split capacitor CA2 is accounted for in the illustrated embodiment.

Of note the double-split-capacitor DAC 110 of FIGS. 2 and 3 is just one example of a competent DAC that might be incorporated within the ADC 100 according to various embodiments of the inventive concept. A ladder-capacitor DAC, for example, might be alternately used.

Figure 4:
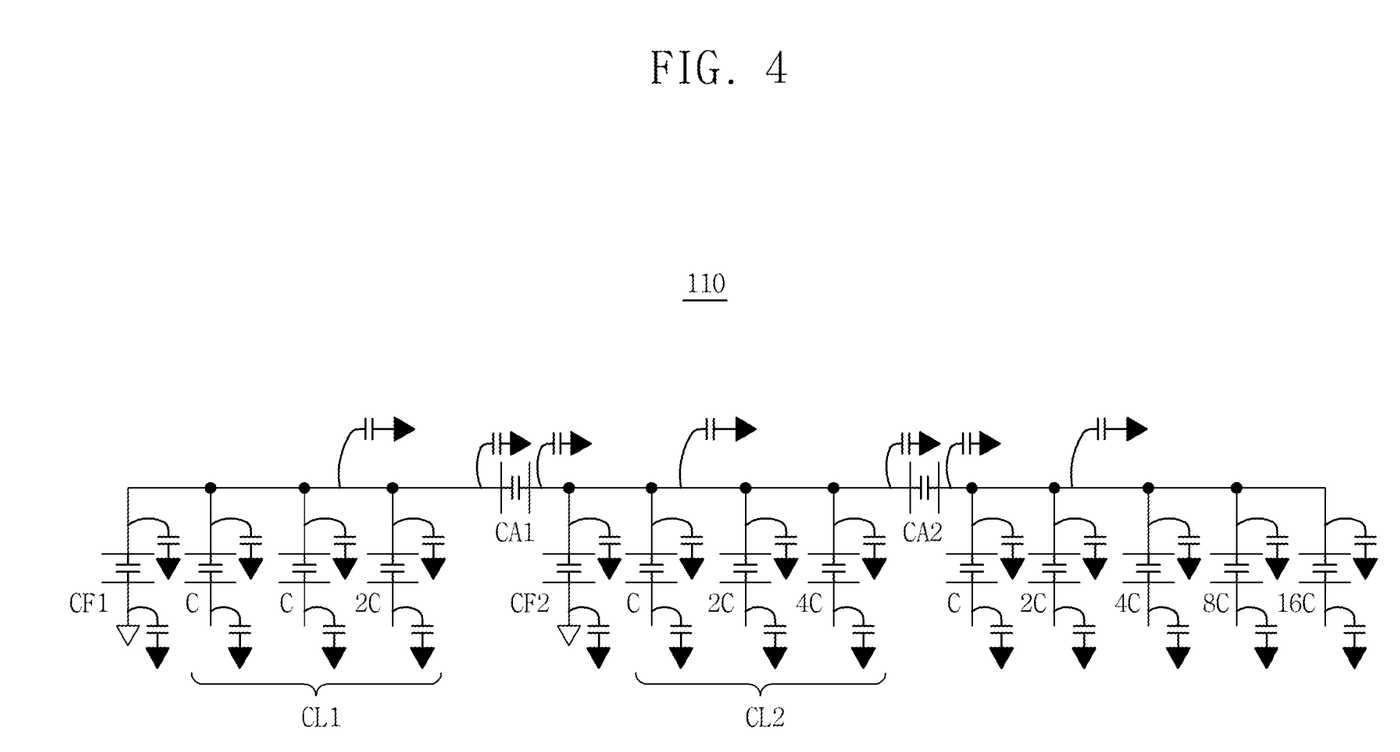
FIG. 4 is a diagram conceptually illustrating certain parasitic capacitors associated with the capacitor array of the DAC shown in FIG. 3.

FIG. 4 is a circuit diagram further illustrating the parasitic capacitors (CP1, CP2) accounted for in the design and operation of the DAC 110 of FIGS. 2 and 3. Those skilled in the art will recognize that the DAC 110 will inherently include certain parasitic capacitances like those modeled in FIG. 4 and which are apparent at each node of constituent capacitors of DAC 110, including the capacitors arranged in the respective capacitor banks (112, 114, 114) and also effective capacitors associated with the conductive lines connecting elements in the DAC 110.

Figure 5:
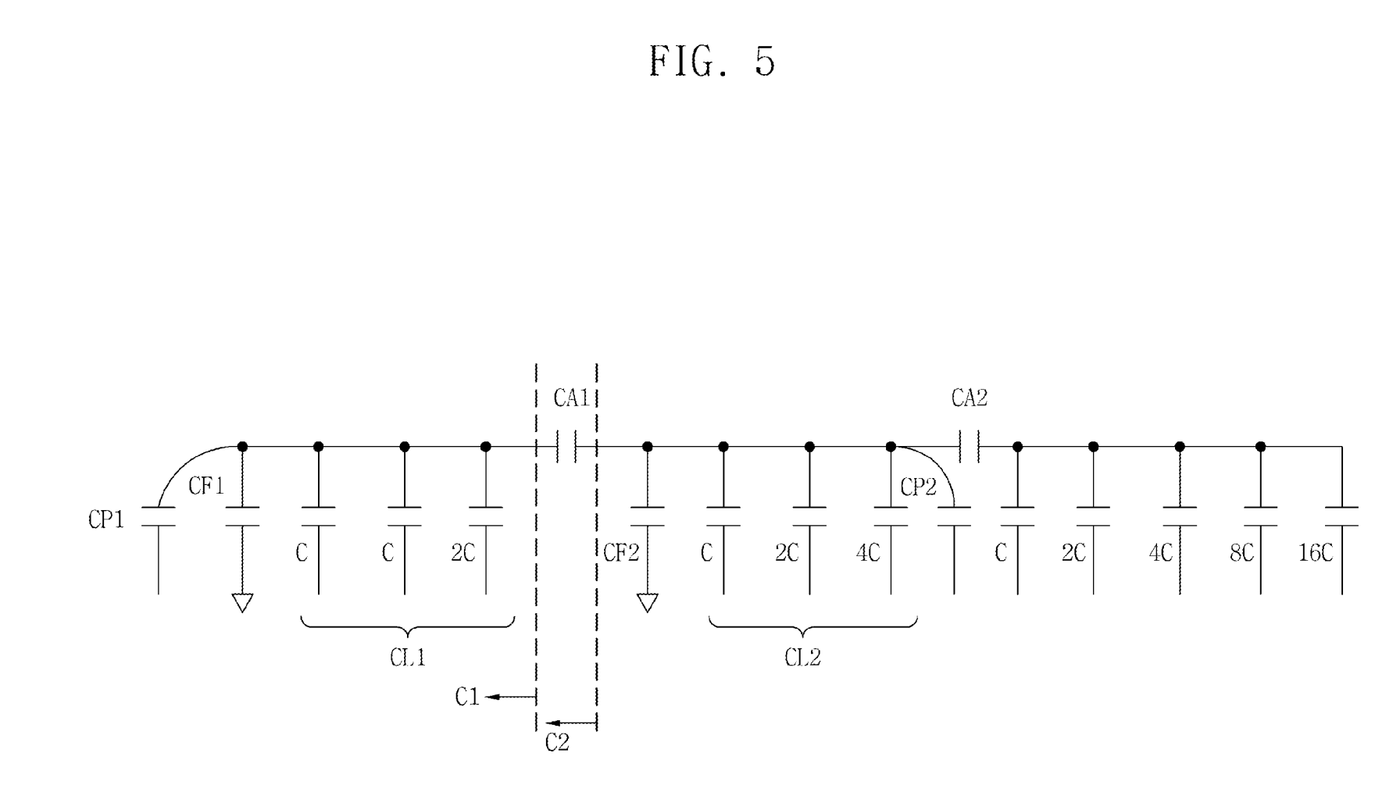
FIG. 5 and FIG. 6 are diagrams illustrating one possible approach to determining the capacitance of dummy capacitors that may be included in the capacitor array of the DAC shown in FIG. 3.
Figure 6:
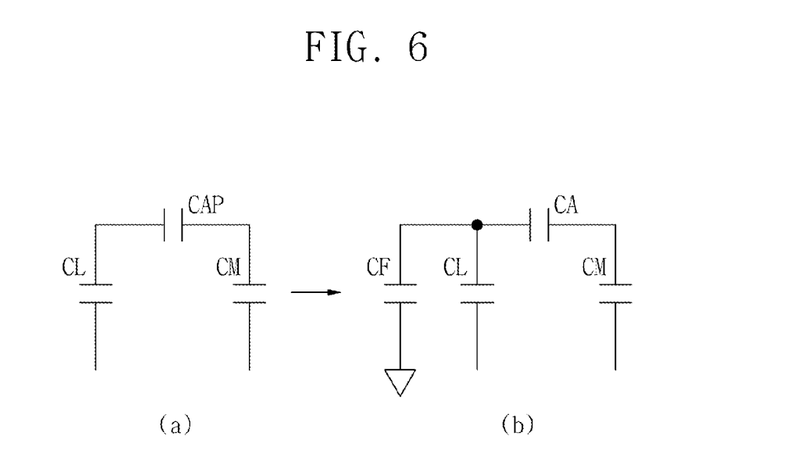

FIG. 5 and FIG. 6 are additional circuit diagrams illustrating one approach to determining or effectively modeling an appropriate capacitance for the dummy capacitors (CF1, CF2) included in the capacitor array of the DAC 110 of FIG. 3. FIGS. 5 and 6 should be considered with FIG. 4.

FIG. 5 shows the first parasitic capacitance CP1 and the second parasitic capacitance CP2 which are respectively associated with conductive line(s) connected to the first split capacitor CA1 and the second split capacitor CA2. The effective (switch-selected) capacitance of the first capacitor bank 112 is indicated by CL1 and the effective (switch-selected) capacitance of the second capacitor bank 114 is indicated by CL2 in FIG. 5. The "apparent" or the cumulative capacitance "seen by" or connected to the first terminal of the first split capacitor CA1 is indicated in FIG. 5 as C1. Similarly, the apparent capacitance seen by the second terminal of the first split capacitor CA1 is indicated in FIG. 5 as C2. Finally, in FIG. 5, the capacitance of the first dummy capacitor is indicated by CF1 and the capacitance of the second dummy capacitor is indicated by CF2.

As described below, the capacitance CF1 of the first dummy capacitor may be expressed by Equation 1 and the capacitance CF2 of the second dummy capacitor may be expressed Equation 2.

$$CF1 = CA1(CL1-1) - CL1 - CP1. \tag{1}$$

$$CF2 = CA2(CL2+1-1) - (CL2+1) - C2 + 1 - CP2. \tag{2}$$

Referring now to FIG. 6, equivalent circuit (a) models the capacitor DAC without addition of dummy capacitor(s), while circuit (b) models the same, albeit with one or more dummy split capacitors added. In FIG. 6, the capacitance of the dummy capacitor(s) is indicated by "CA" and "CM" is the unit capacitance. In the circuit (a) of FIG. 6, variation of the capacitance seen by the second terminal of the split capacitor CAP is given by Equation 3 below, where CL and CM are assumed to vary. In the circuit (b) of FIG. 6, variation of capacitance seen by the second terminal of the split capacitor CA is given by Equation 4, again where CL and CM are assumed to vary.

$$\Delta CAP = (CAP \times (CM+CL) + CL \times CM)/(CAP \times (CM+CL-1) + CL \times (CM-1)) \quad (3)$$

$$\Delta CA = (CA \times (CM+CL) + (CL+CF) \times CM)/(CA \times (CM+CL-1) + CL \times (CM-1) + (C-1) \times CF) \quad (4)$$

Here, since CM is the capacitance of the unit capacitor, CM becomes 1, and a composite capacitance (CL//CLP) of a serial connection of CL and CLP becomes 1. Thus, CAP=CL/(CL-1) and Equation 5 holds.

$$(CAP \times (1+CL) + CL)/(CAP \times CL) = 2. \quad (5)$$

Accordingly, Equation 4 above may be simplified to Equation 6.

$$(CA \times (1+CL) + (CL+CF))/(CA \times CL) = 2. \quad (6)$$

Thus, an appropriate capacitance for the dummy capacitor may be obtained using Equation 7.

$$CF = (CL-1) \times CA - CL \quad (7)$$

Therefore, the capacitance of dummy capacitors CF1 and CF2 and the capacitance of the split capacitors CA1 and CA2 included in a double-split-capacitor DAC according to certain embodiments of the inventive concept may be obtained using the foregoing approach.

By adding dummy capacitors having appropriately calculated capacitance, the capacitance of capacitors included in capacitor DACs according to certain embodiments of the inventive concept may be defined to have respective capacitances that are multiple of the capacitance of a unit capacitor. As a result, an ADC including a DAC, such as those described above in relation to FIGS. 2 through 5, may be successfully operated at higher speed with excellent resolution.

Figure 7:
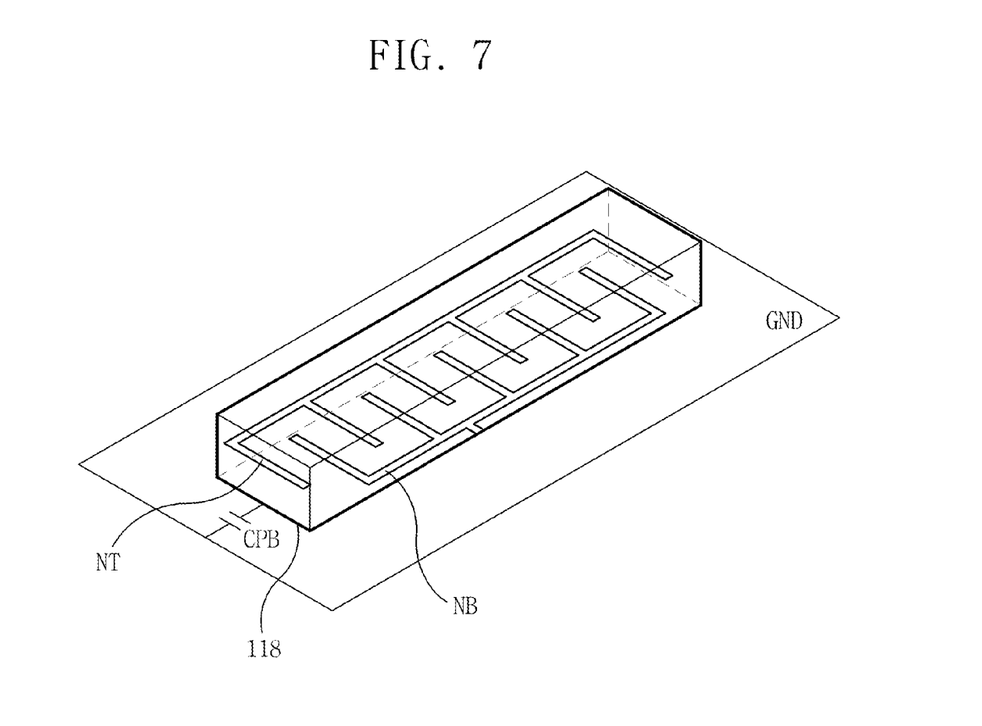
FIG. 7 is a perspective view illustrating one possible example of a capacitor having a structure that reduces the influence of parasitic capacitance in the DAC of FIG. 3.
Figure 8:
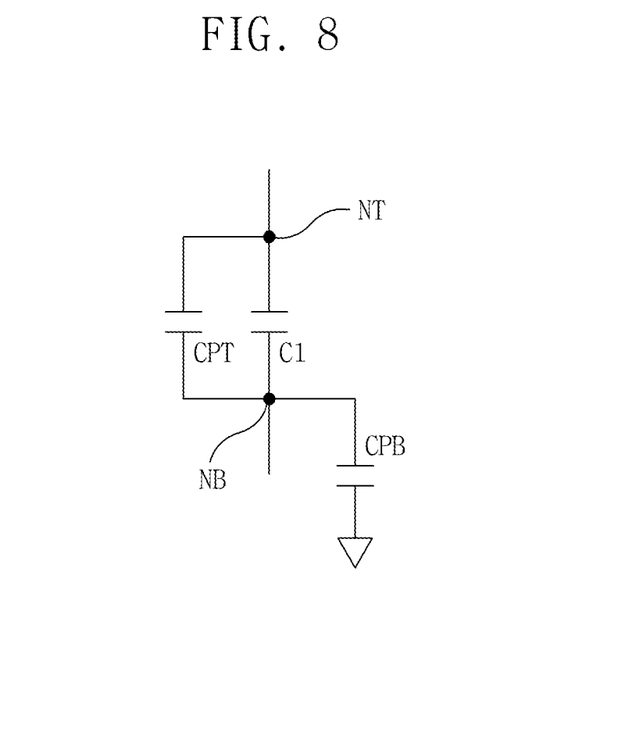
FIG. 8 is a circuit diagram illustrating an equivalent circuit of a capacitor having the structure of FIG. 7.

FIG. 7 is a perspective view illustrating one possible example of a capacitor having a structure that reduces the influence of parasitic capacitance in the DAC 110 of FIG. 3. FIG. 8 is a circuit diagram illustrating an equivalent circuit for the capacitor of FIG. 7.

Referring to FIGS. 7 and 8, a horizontal parasitic capacitance CPB arises between a bottom node NB and the ground, and a vertical parasitic capacitance CPT arises between a top node NT and the bottom node NB. Referring to FIG. 7, the top node NT is encapsulated by conductive material 118 electrically connected to the bottom node NB.

Therefore, in a DAC according to an embodiment of the inventive concept, a horizontal parasitic capacitance between the ground and the bottom node NB that may adversely affect the performance of the DAC may be effectively converted into a vertical parasitic capacitance between the top node NT and the bottom node NB that is fully accounted for in the DAC design. Therefore, the capacitance of the unit capacitor for a DAC according to an embodiment of the inventive concept may be greater yet more stable than the capacitance of a unit capacitor in conventional DACs. Therefore, an ADC according to embodiments of the inventive concept and including a DAC like DAC 110 described above may be successfully operated at higher speed with excellent resolution.

Further, in the DAC 110 in accordance with certain embodiments of the inventive concept, variation of parasitic capacitance due to process variations may be uniform for the whole circuit because the whole circuit is implemented using a unit capacitor. Therefore, the DAC 110 will not suffer ill-effects of unbalanced overall charge distribution. Accordingly, the DAC 110 according to embodiments of the inventive concept may be designed in a manner that provides for markedly greater immunity to process variations.

Figure 9:
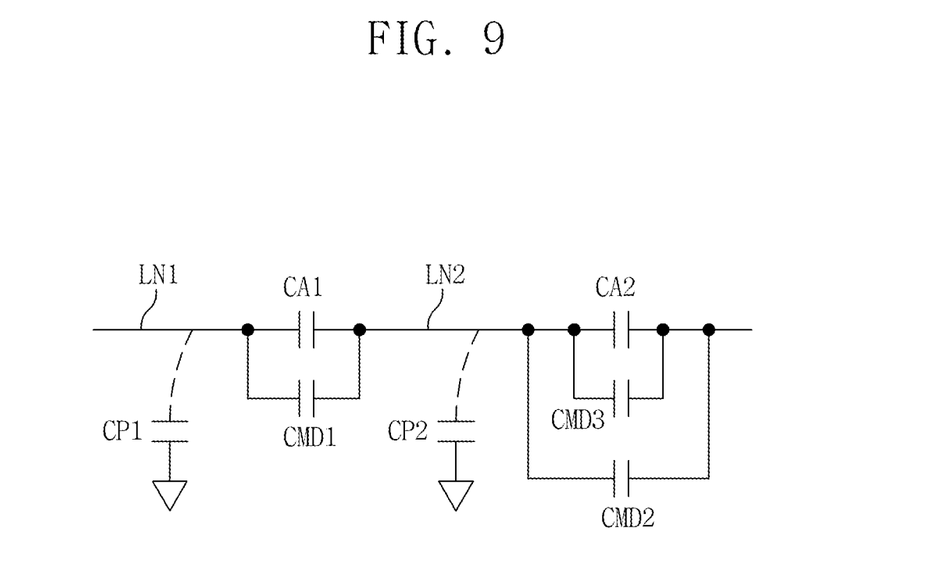
FIG. 9 is a circuit diagram illustrating one possible approach to the compensation of parasitic capacitances in lines connected to terminals of the split capacitors in the DAC of FIG. 3.

FIG. 9 is a circuit diagram illustrating one possible example of an approach to compensation for parasitic capacitors in conductive line(s) connected to both terminals of split capacitors included in the DAC 110 of FIGS. 3 through 5.

In FIG. 9, the split capacitors CA1 and CA2, the parasitic capacitances CP1 and CP2, and compensating capacitors CMD1, CMD2 and CMD3 connected to the conductive lines LN1 and LN2 in a capacitor array of the DAC of FIG. 5 are shown for convenience. However, the capacitor banks and the dummy capacitors may be connected to the conductive lines LN1 and LN2.

In FIG. 9, the first compensating capacitor CMD1, the second compensating capacitor CMD2 and the third compensating capacitor CMD3 provide compensation for the parasitic capacitance CP1 of the first conductive line LN1 and the parasitic capacitance CP2 of the second conductive line LN2.

The first compensating capacitor CMD1 is connected across the first split capacitor CA1 and has one third the parasitic capacitance of a first conductive line LN1 connected to a first terminal of the first split capacitor CA1. The second compensating capacitor CMD2 is connected across the second split capacitor CA2, and has one seventh the parasitic capacitance of the second conductive line LN2 connected between the second terminal of the first split capacitor CA1 and the first terminal of the second split capacitor CA2. The third compensating capacitor CMD3 is connected across the second split capacitor CA2 and has one twenty-eighth the parasitic capacitance of the first conductive line LN1.

The capacitance of compensating capacitors used in the DAC for compensating for the parasitic capacitance CP1 of the first conductive line LN1 and the parasitic capacitance CP2 of the first conductive line LN2 may be determined using Equations 8 through 11.

Referring to FIG. 9, equations 8 and 9 may be derived from equation 1 above:

$$CA1 + CMD1 = (CF1 + CL1 + CP1)/(CL1 - 1) = 2 + CP1/3 \quad (8)$$

$$CMD1 = CP1/3 \quad (9)$$

Referring to FIG. 9, equations 10 and 11 may be derived from equation 2.

$$CA2 + CMD2 = (CF2 + CL2 + C2 + CP2)/CL2 = (12.5 + C2 + CP2)/7 = 2 + (CP1 + 4 \times CP2)/28 \quad (10)$$

$$CMD4 = CMD2 + CMD3 = CP2/7 + CP1/28 \quad (11)$$

Figure 10:
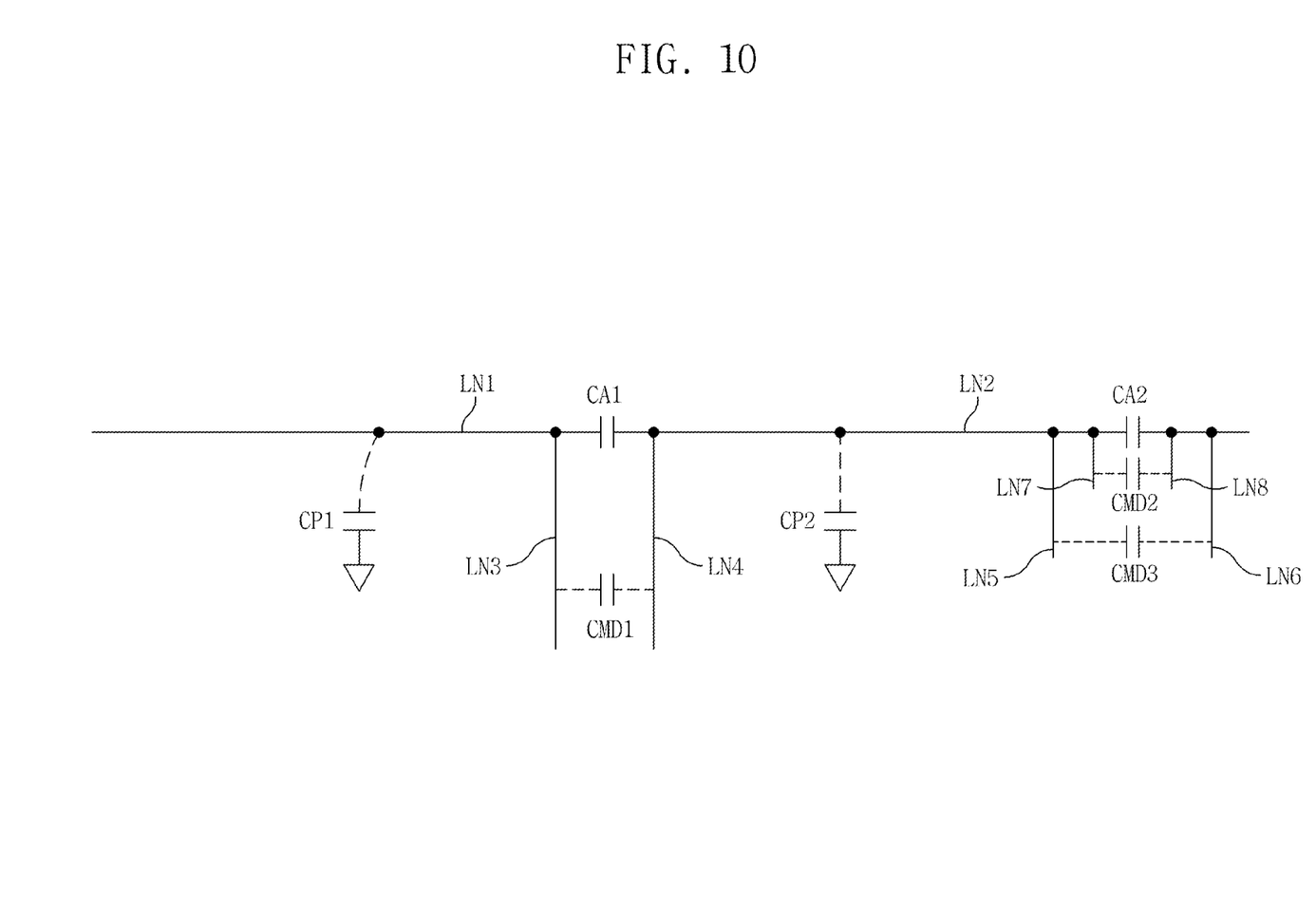
FIG. 10 is a circuit diagram further illustrating the approach of FIG. 9 as implemented in a semiconductor integrated circuit.

FIG. 10 is a circuit diagram illustrating one possible approach to compensating capacitors of FIG. 9, as implemented in a semiconductor integrated circuit.

Referring to FIG. 10, the compensating capacitors CMD1, CMD2 and CMD3 may be implemented using conductive lines that have a length proportional to the length of the conductive lines LN1 and LN2 connected to the split capacitors CA1 and CA2 and are connected in parallel to the split capacitors CA1 and CA2.

The first compensating capacitor CMD1 may include two conductive lines LN3 and LN4 connected to the first terminal and the second terminal of the first split capacitor CA1. Each of the two conductive lines has one third the length of the first conductive line LN1. The second compensating capacitor CMD2 may include two conductive lines LN5 and LN6 connected to the first terminal and the second terminal of the second split capacitor CA2. Each of the two conductive lines has one seventh the length of the second conductive line LN2. The third compensating capacitor CMD3 may include two conductive lines LN7 and LN8 connected to the first terminal and the second terminal of the second split capacitor CA2. Each of the two conductive lines has one twenty-eighth the length of the first conductive line LN1.

For example, the conductive lines LN3 and LN4 may be replicas of the first conductive line LN1, and the conductive lines LN5 and LN6 and the conductive lines LN7 and LN8 may be replicas of the second conductive line LN2.

Figure 11:
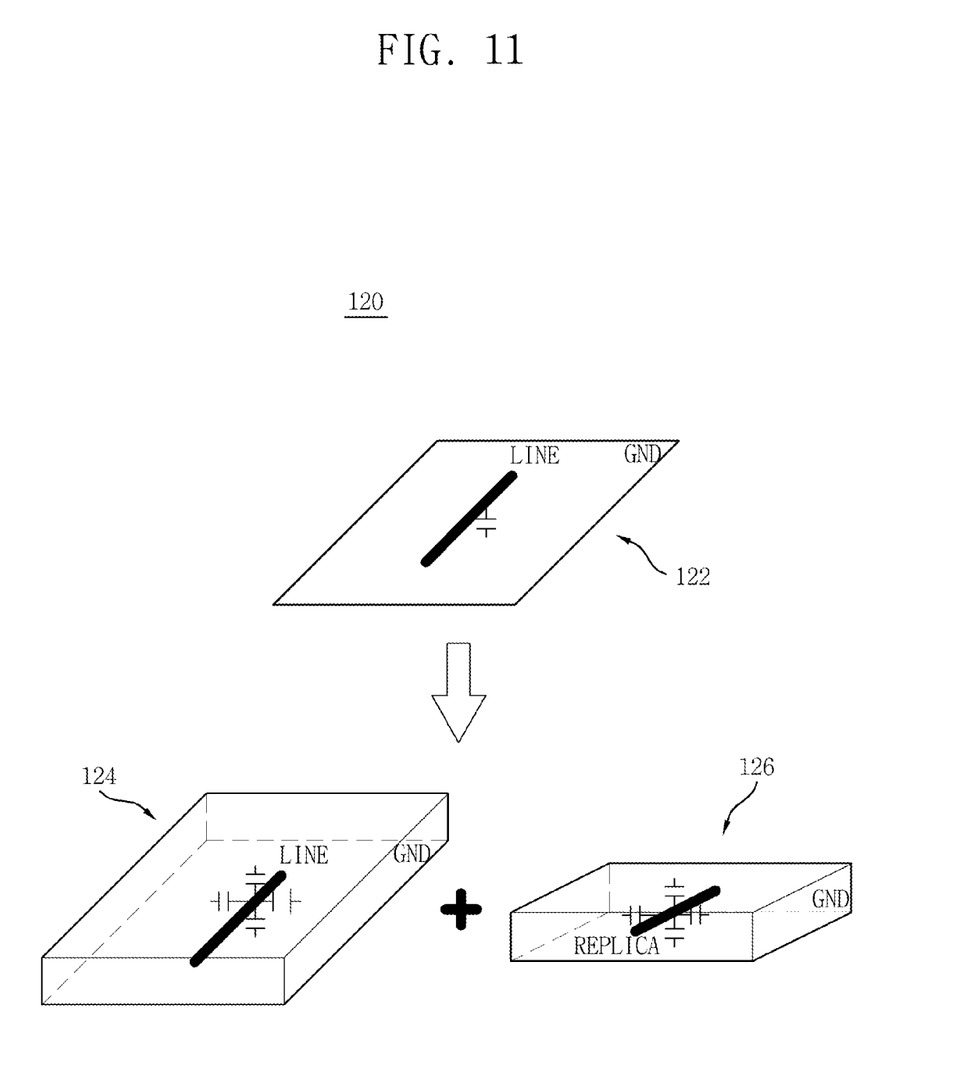
FIG. 11 is a diagram illustrating an encapsulated structure for a conductive line and a replica line included in the DAC of FIG. 3.

FIG. 11 is a diagram illustrating an encapsulated structure of a conductive line and a replica line that may be included in the DAC 110 of FIG. 3.

Referring to FIG. 11, both the conductive line and the replica line are encapsulated with conductive material. When the conductive line and the replica of the conductive line are encapsulated as shown in FIGS. 10 and 11, parasitic capacitance will exist only between each conductive line and ground. Therefore, precise compensating capacitors may be implemented using conductive lines, and also dummy capacitors may be implemented using conductive lines and their replicas.

As described above, the deterioration of capacitor performance due to process variation of the compensating capacitors CMD1, CMD2 and CMD3 may be decreased.

Figure 12:
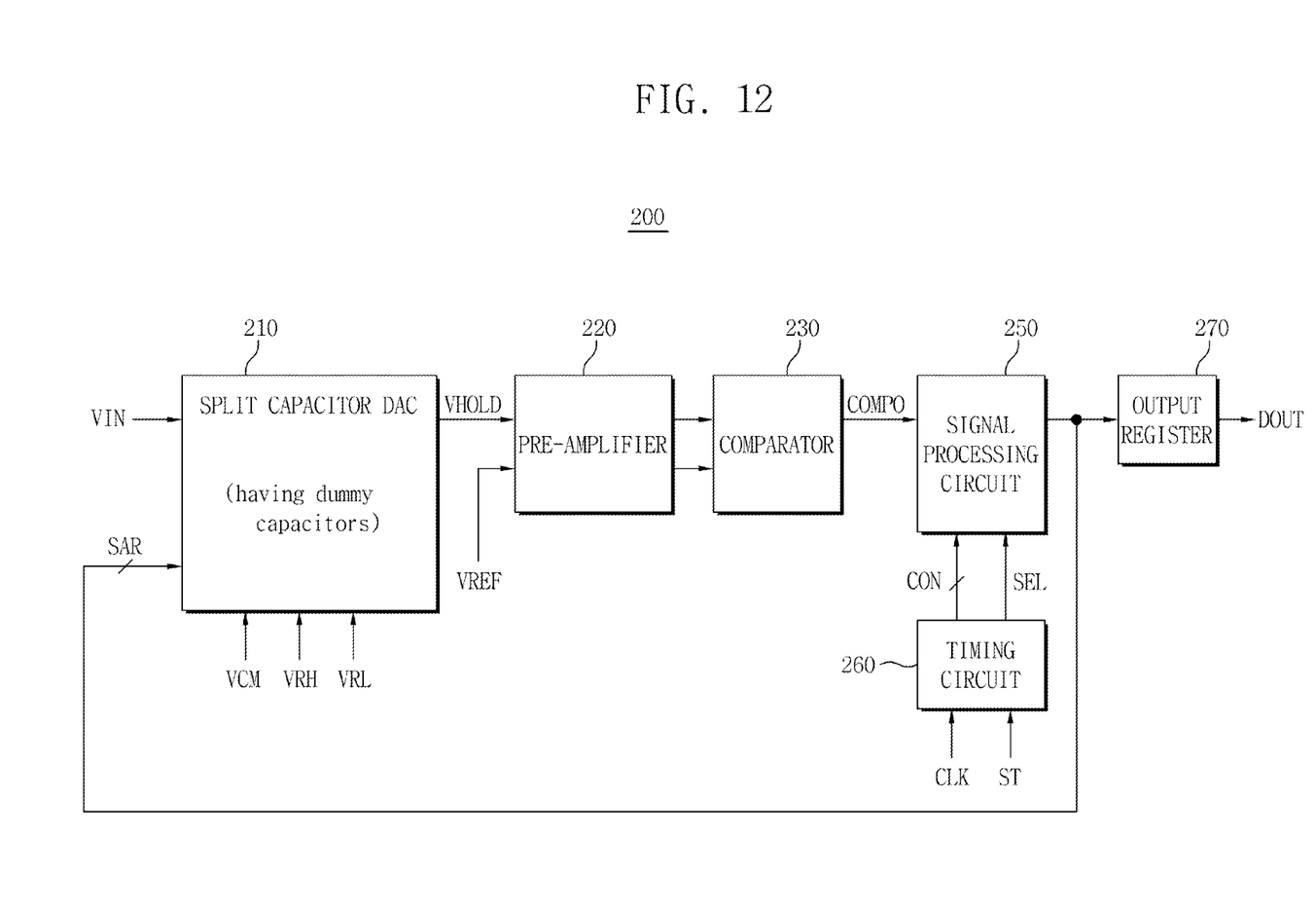
FIG. 12 is a block diagram illustrating an ADC in accordance with another embodiment of the inventive concept.

FIG. 12 is a block diagram illustrating an ADC 200 in accordance with another embodiment of the inventive concept.

Referring to FIG. 12, the ADC 200 includes a digital-to-analog converter (DAC) 210, a preamplifier 220, a comparator circuit 230 and a signal processing circuit 250.

The DAC 210 includes a capacitor array including at least one split capacitor having a capacitance that is a multiple of a unit capacitance and capacitors having respective capacitances that multiple(s) of the unit capacitance. The DAC 210 converts digital output SAR into a corresponding analog signal in a manner like that previously described in relation to FIG. 2 However, the preamplifier 220 is additionally provided to amplify a difference between the hold voltage signal VHOLD and the reference voltage signal VREF.

Figure 13:
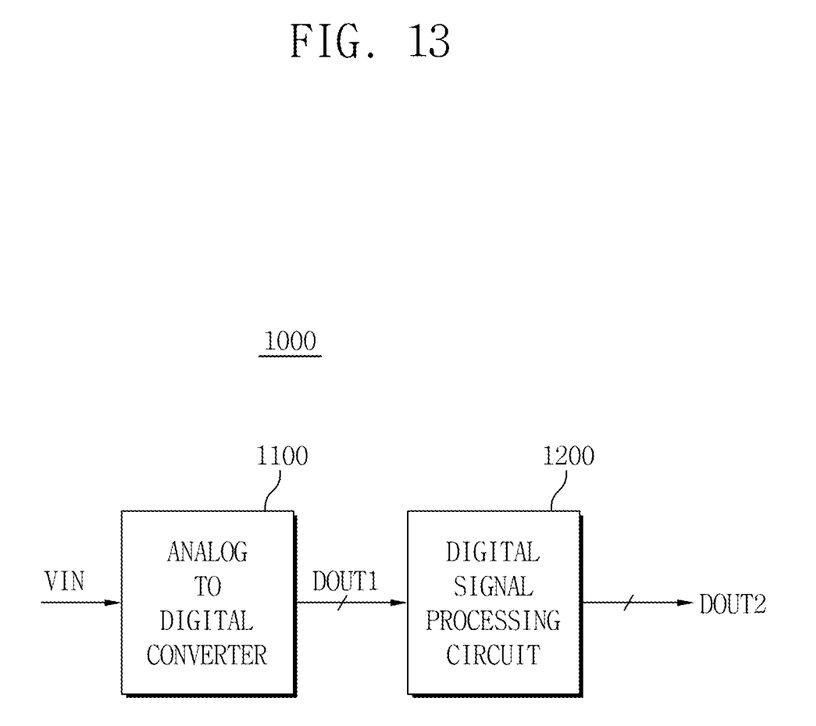
FIG. 13 is a block diagram illustrating a semiconductor device incorporating an ADC such as the ones shown in FIGS. 1 or FIG. 12 in accordance with an embodiment of the inventive concept.

FIG. 13 is a block diagram illustrating a semiconductor device 1000 that includes an ADC, like the ones shown in FIGS. 1 and 12, that is designed in accordance with an embodiment of the inventive concept.

Referring to FIG. 13, the semiconductor device 1000 generally comprises an ADC 1100 and a digital signal processing circuit 1200.

The ADC 1100 converts an analog input signal VIN to a corresponding digital signal and generates a first digital output data DOUT1. The digital signal processing circuit 1200 performs digital signal processing on the first digital output data DOUT1 to generate a second digital output data DOUT2.

ADCs according to embodiments of the inventive concept include a DAC having dummy capacitors, and capacitors included in the DAC have a capacitance that is a multiple of a capacitance of a unit capacitor. Because capacitors included in the DAC of the ADC according to embodiments of the inventive concept have a capacitance that is a multiple of a capacitance of a unit capacitor, design of an integrated circuit is relatively straightforward. Further, the ADC may include compensating capacitors across split capacitors that are able to compensate for deterioration of capacitor performance characteristics caused by parasitic capacitance in a capacitor array. Therefore, the ADC according to embodiments of the inventive concept is relatively insensitive to process variations and may be operated at relatively high speed with excellent resolution.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. Therefore, it is to be understood that the foregoing is illustrative of various embodiments and not to be construed as limiting of the inventive concept to the specific embodiments disclosed, and that modifications to the disclosed embodiments, as well as other embodiments, are intended to be included within the scope of the appended claims.

What is claimed is:

1. A split-capacitor digital-to-analog converter comprising:
   a first capacitor bank including a plurality of capacitors, each of the plurality of capacitors of the first capacitor bank having a capacitance that is a product of an integer and a unit capacitance, each of the plurality of capacitors of the first capacitor bank being connected to a first common node;
   a second capacitor bank including a plurality of capacitors, each of the plurality of capacitors of the second capacitor bank having a capacitance that is a product of an integer and the unit capacitance, each of the plurality of capacitors of the second capacitor bank being connected to a second common node;
   a first split capacitor connected to the first common node and to the second common node;
   a first dummy capacitor connected to the first common node; and
   a second dummy capacitor connected to the second common node,
   wherein each of the first split capacitor and the first dummy capacitor has a capacitance that is a product of an integer and the unit capacitance.

2. The split-capacitor digital-to-analog converter of claim 1, wherein the capacitance of the first dummy capacitor is different from a capacitance of the second dummy capacitor.

3. The split-capacitor digital-to-analog converter of claim 1, wherein the second dummy capacitor is immediately adjacent to the first split capacitor.

4. The split-capacitor digital-to-analog converter of claim 1, wherein the second dummy capacitor has a capacitance that is a product of an integer and the unit capacitance.

5. The split-capacitor digital-to-analog converter of claim 1, wherein the second dummy capacitor has a capacitance that is a product of a non-integer and the unit capacitance.

6. The split-capacitor digital-to-analog converter of claim 1, wherein a capacitance of the first dummy capacitor is determined based on the capacitance of the first split capacitor and an effective capacitance of the first capacitor bank.

7. The split-capacitor digital-to-analog converter of claim 6, wherein the capacitance of the first dummy capacitor is determined such that each capacitance of the plurality of capacitors in the first bank is a product of an integer and the unit capacitance.

8. The split-capacitor digital-to-analog converter of claim 1, wherein the first capacitor bank consists essentially of a first capacitor, a second capacitor and a third capacitor, and the second capacitor bank consists essentially of a fourth capacitor, a fifth capacitor and a sixth capacitor.

9. The split-capacitor digital-to-analog converter of claim 8, wherein each of the first capacitor, the second capacitor and the fourth capacitor has the unit capacitance,
each of the third capacitor and the fifth capacitor has a capacitance that is twice the unit capacitance, and
the sixth capacitor has a capacitance that is four time the unit capacitance.

10. The split-capacitor digital-to-analog converter of claim 1 further comprising:
a third capacitor bank including a plurality of capacitors, each of the plurality of capacitors of the third capacitor bank having a capacitance that is a product of an integer and the unit capacitance, each of the plurality of capacitors of the third capacitor bank being connected to a third common node; and
a second split capacitor connected to the second common node and the third common node, the second split capacitor having a capacitance that is a product of an integer and the unit capacitance.

11. The split-capacitor digital-to-analog converter of claim 10, wherein a capacitance of the second dummy capacitor is determined based on the capacitance of the first split capacitor, the capacitance of the second split capacitor, the capacitance of the first dummy capacitor, an effective capacitance of the first capacitor bank and an effective capacitance of the second capacitor bank.

12. The split-capacitor digital-to-analog converter of claim 11, wherein the capacitance of the second dummy capacitor is determined such that each capacitance of the plurality of capacitors in the second bank is a product of an integer and the unit capacitance.

13. The split-capacitor digital-to-analog converter of claim 10 further comprising a first parasitic capacitor connected to the first common node, and a second parasitic capacitor connected to the second common node.

14. The split-capacitor digital-to-analog converter of claim 10, wherein the third capacitor bank consists essentially of a seventh capacitor having the unit capacitance, an eighth capacitor having has a capacitance that is twice the unit capacitance, a ninth capacitor having a capacitance that is four times the unit capacitance, a tenth capacitor having a capacitance that is eight times the unit capacitance, and an eleventh capacitor having a capacitance that is sixteen times the unit capacitance.

15. A double split-capacitor digital-to-analog converter comprising:
a first capacitor bank including a plurality of capacitors, each of the plurality of capacitors of the first capacitor bank having a capacitance that is a product of an integer and a unit capacitance, each of the plurality of capacitors of the first capacitor bank being connected to a first common node;
a second capacitor bank including a plurality of capacitors, each of the plurality of capacitors of the second capacitor bank having a capacitance that is a product of an integer and the unit capacitance, each of the plurality of capacitors of the second capacitor bank being connected to a second common node;
a third capacitor bank including a plurality of capacitors, each of the plurality of capacitors of the third capacitor bank having a capacitance that is a product of an integer and the unit capacitance, each of the plurality of capacitors of the third capacitor bank being connected to a third common node;
a first split capacitor connected to the first common node and to the second common node, the first split capacitor having a capacitance that is a product of an integer and the unit capacitance;
a second split capacitor connected to the second common node and the third common node, the second split capacitor having a capacitance that is a product of an integer and the unit capacitance;
a first dummy capacitor connected to the first common node, the first dummy capacitor having has a capacitance that is a product of an integer and the unit capacitance; and
a second dummy capacitor connected to the second common node.

16. The double split-capacitor digital-to-analog converter of claim 15, wherein the second dummy capacitor has a capacitance that is a product of a non-integer and the unit capacitance.

17. The double split-capacitor digital-to-analog converter of claim 15 further comprising:
a first conductive line electrically connected to a first terminal of the first split capacitor;
a second conductive line electrically connected to a second terminal of the first split capacitor and to a first terminal of the second split capacitor; and
a third conductive line electrically connected to a second terminal of the second split capacitor.

18. The double split-capacitor digital-to-analog converter of claim 17, wherein the first capacitor bank is electrically connected to the first conductive line, the second capacitor bank is electrically connected to the second conductive line, and the third capacitor bank is electrically connected to the third conductive line.

19. A split-capacitor digital-to-analog converter comprising:
a plurality of capacitor banks including a first capacitor bank and a second capacitor bank, the first capacitor bank including a plurality of capacitors, the second capacitor bank including a plurality of capacitors;
a split capacitor connected to the first capacitor bank and to the second capacitor bank;
a first dummy capacitor connected to the first capacitor bank; and
a second dummy capacitor connected to the second capacitor bank,
wherein each of the split capacitor and the first dummy capacitor has a capacitance that is a product of an integer and a unit capacitance.

20. The split-capacitor digital-to-analog converter of claim 19, wherein the second dummy capacitor has a capacitance that is a product of an integer and a unit capacitance.

21. The split-capacitor digital-to-analog converter of claim 19, wherein the second dummy capacitor has a capacitance that is a product of a non-integer and a unit capacitance.

22. An analog-to-digital converter comprising:
a split-capacitor digital-to-analog converter configured to convert a digital output signal into a first voltage signal using an analog input signal;
a comparator circuit configured to compare the first voltage signal with a reference voltage signal to generate a comparison output voltage signal; and
a signal processing circuit configured to perform a successive approximation based on the comparison output voltage signal to generate the digital output signal,
wherein the split-capacitor digital-to-analog converter comprises:

a first capacitor bank including a plurality of capacitors, each of the plurality of capacitors of the first capacitor bank having a capacitance that is a product of an integer and a unit capacitance, each of the plurality of capacitors of the first capacitor bank being connected to a first common node;

a second capacitor bank including a plurality of capacitors, each of the plurality of capacitors of the second capacitor bank having a capacitance that is a product of an integer and the unit capacitance, each of the plurality of capacitors of the second capacitor bank being connected to a second common node;

a first split capacitor connected to the first common node and to the second common node, the first split capacitor having a capacitance that is a product of an integer and the unit capacitance;

a first dummy capacitor connected to the first common node, the first dummy capacitor having a capacitance that is a product of an integer and the unit capacitance; and a second dummy capacitor connected to the second common node.

23. A split-capacitor digital-to-analog converter comprising:

a plurality of capacitor banks including a first capacitor bank, a second capacitor bank and a third capacitor bank, the first capacitor bank including a plurality of capacitors, each of the plurality of capacitors of the first capacitor bank being connected to a first common node and having a capacitance that is a product of an integer and a unit capacitance, the second capacitor bank including a plurality of capacitors, each of the plurality of capacitors of the second capacitor bank being connected to a second common node and having a capacitance that is a product of an integer and the unit capacitance, the third capacitor bank including a plurality of capacitors, each of the plurality of capacitors of the third capacitor bank being connected to a third common node and having a capacitance that is a product of an integer and the unit capacitance;

a first split capacitor connected to the first common node and to the second common node;

a second split capacitor connected to the second common node and the third common node;

a first dummy capacitor connected to the first common node; and a second dummy capacitor connected to the second common node, wherein each of the first split capacitor, the second split capacitor and the first dummy capacitor has a capacitance that is a product of an integer and the unit capacitance.

24. A split-capacitor digital-to-analog converter comprising:

a first capacitor array including a first capacitor bank and a first dummy capacitor, the first capacitor bank including a plurality of capacitors;

a second capacitor array including a second capacitor bank and a second dummy capacitor, the second capacitor bank including a plurality of capacitors; and a first split capacitor connected to the first capacitor array and the second capacitor array, the first split capacitor having a capacitance that is a product of an integer and a unit capacitance, wherein the second dummy capacitor includes at least one capacitor having the unit capacitance.

25. The split-capacitor digital-to-analog converter of claim 24, wherein the first dummy capacitor includes at least one capacitor having the unit capacitance.

26. The split-capacitor digital-to-analog converter of claim 25, wherein each of the first dummy capacitor and the second dummy capacitor includes two or more capacitors, each of the two or more capacitors having the unit capacitance.

27. The split-capacitor digital-to-analog converter of claim 24, wherein each of the plurality of capacitors in the first capacitor bank and the second capacitor bank includes at least one capacitor having the unit capacitance.

28. The split-capacitor digital-to-analog converter of claim 27, wherein each of the plurality of capacitors in the first capacitor bank and the second capacitor bank includes two or more capacitors, each of the two or more capacitors having the unit capacitance.

29. The split-capacitor digital-to-analog converter of claim 24, wherein the first split capacitor includes at least one capacitor having the unit capacitance.

30. The split-capacitor digital-to-analog converter of claim 29, wherein the first split capacitor includes two or more capacitors, each of the two or more capacitors having the unit capacitance.

31. A split-capacitor digital-to-analog converter comprising:

a first capacitor array including a first capacitor bank and a first dummy capacitor, the first capacitor bank including a plurality of capacitors;

a second capacitor array including a second capacitor bank and a second dummy capacitor, the second capacitor bank including a plurality of capacitors; and a first split capacitor connected to the first capacitor array and the second capacitor array, wherein a first node and a second node of the first dummy capacitor are electronically connected, and a first node and a second node of the second dummy capacitor are electronically connected.

32. The split-capacitor digital-to-analog converter of claim 31, wherein the second node of the first dummy capacitor and the second node of the second dummy capacitor are connected to a ground.

33. The split-capacitor digital-to-analog converter of claim 31, wherein the first node and the second node of the first dummy capacitor, and the first node and the second node of the second dummy capacitor are encapsulated by a conductive material.

34. The split-capacitor digital-to-analog converter of claim 31, wherein a first node and a second node of each of the plurality of capacitors in the first capacitor bank and the second capacitor bank are electronically connected.

* * * * *